(12) United States Patent
Suzuki

(10) Patent No.: US 10,128,548 B2
(45) Date of Patent: Nov. 13, 2018

(54) BATTERY DEVICE, AND PROTECTION METHOD THEREOF

(71) Applicant: MAKITA CORPORATION, Anjo-shi, Aichi (JP)

(72) Inventor: Hitoshi Suzuki, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 59 days.

(21) Appl. No.: 15/590,364

(22) Filed: May 9, 2017

(65) Prior Publication Data

US 2017/0331161 A1 Nov. 16, 2017

(30) Foreign Application Priority Data

May 16, 2016 (JP) ................... 2016-097920

(51) Int. Cl.
| | | |
|---|---|---|
| *H02J 7/00* | (2006.01) | |
| *H01M 10/48* | (2006.01) | |
| *B60L 3/00* | (2006.01) | |
| *G01R 31/36* | (2006.01) | |
| *G08B 21/00* | (2006.01) | |
| *H01M 10/44* | (2006.01) | |
| *G01R 31/44* | (2006.01) | |

(52) U.S. Cl.
CPC .......... *H01M 10/48* (2013.01); *B60L 3/0046* (2013.01); *G01R 31/36* (2013.01); *G01R 31/3682* (2013.01); *G01R 31/44* (2013.01); *G08B 21/00* (2013.01); *H01M 10/44* (2013.01); *H02J 7/00* (2013.01); *H02J 7/0021* (2013.01); *H02J 7/0026* (2013.01); *H02J 2007/0001* (2013.01); *H02J 2007/0037* (2013.01)

(58) Field of Classification Search
CPC ...... H01M 10/48; H01M 10/44; G01R 31/44; G01R 31/3682; G01R 31/36; H02J 7/0021; H02J 7/0026; H02J 7/00; B60L 3/0046; G08B 21/00
USPC ......................................................... 320/136
See application file for complete search history.

(56) References Cited

U.S. PATENT DOCUMENTS

| | | | | |
|---|---|---|---|---|
| 5,705,913 | A * | 1/1998 | Takeuchi | H02J 7/0031 320/134 |
| 8,163,411 | B2 * | 4/2012 | Mizoguchi | H01M 10/4207 320/134 |
| 8,489,347 | B2 * | 7/2013 | Shimizu | G01R 31/3658 702/62 |
| 9,024,572 | B2 * | 5/2015 | Nishihara | H01M 2/1077 320/107 |
| 9,570,924 | B2 * | 2/2017 | Endo | H01M 2/1072 |
| 9,583,793 | B2 * | 2/2017 | White | H02J 7/0024 |
| 9,634,500 | B2 * | 4/2017 | Kamata | H02J 7/0021 |
| 2008/0100266 | A1 * | 5/2008 | Sobue | G01R 31/3658 320/134 |
| 2012/0045667 | A1 | 2/2012 | Yoneda et al. | |

FOREIGN PATENT DOCUMENTS

JP 5592194 B2 9/2014

* cited by examiner

*Primary Examiner* — M'Baye Diao
(74) *Attorney, Agent, or Firm* — Oliff PLC

(57) ABSTRACT

A battery device in one aspect of the present disclosure comprises a battery, a cell voltage monitoring part, a power supply line, a plurality of monitor lines, and an interrupter. The interrupter interrupts the power supply line and all of the plurality of monitor lines when the battery enters an overdischarge state.

15 Claims, 5 Drawing Sheets

BATTERY DEVICE, AND PROTECTION METHOD THEREOF

CROSS-REFERENCE TO RELATED APPLICATIONS

The subject application claims the benefit of Japanese Patent Application No. 20160197920 filed on May 16, 2016 with the Japan Patent Office, and the entire disclosure of Japanese Patent Application No. 2016-097920 is incorporated herein by reference.

BACKGROUND

The present disclosure relates to a battery device comprising a battery.

Japanese Patent No. 5592194 discloses a battery device that comprises a battery and a cell voltage monitoring circuit; the battery comprises a plurality of serially-coupled cells, and the cell voltage monitoring circuit monitors respective cell voltages of the plurality of cells.

It has been known that the cell voltage monitoring circuit has a cell overdischarge detection function for detecting overdischarge of any of the cells. In the cell overdischarge detection function, the cell voltage monitoring circuit carries out a specified process (for example, outputs a specified signal) when any of the cells is in an overdischarge state. The cell voltage monitoring circuit is generally configured to operate with an electric power supplied from the battery.

In the above-described battery device, if the electric power is continuously supplied to the cell voltage monitoring circuit from the battery even after any of the cells has become overdischarged, such an overdischarge state of the overdischarged cell further proceeds, causing failure of this cell; consequently, the battery may not be used anymore. In a case of an inexpensive battery device having a relatively small charge capacity, it is highly likely that if a cell enters the overdischarge state, the overdischarge state quickly proceeds, resulting in failure of the overdischarged cell.

In this regard, there is a known technique to interrupt the supply of the electric power to the cell voltage monitoring circuit from the battery when the cell voltage monitoring circuit detects the overdischarge state of any of the cells. With this technique, when any of the cells enters the overdischarge state, the supply of the electric power to the cell voltage monitoring circuit from the battery is interrupted, thereby stopping an operation of the cell voltage monitoring circuit. Consequently, it is possible to inhibit development of the overdischarge state of the cell.

SUMMARY

Coupled between the battery and the cell voltage monitoring circuit are, not only electric power supplying lines, but also monitor lines for monitoring a cell voltage of each of the cells. For this reason, if the supply of the electric power to the cell voltage monitoring circuit from the battery is interrupted when any of the cells enters the overdischarge state, a leakage current is generated that flows into the cell voltage monitoring circuit from the battery via the monitor lines. As a result, discharge from the battery may not be sufficiently inhibited.

In the inexpensive cell voltage monitoring circuit, a large leakage current may be inputted thereto from the battery via the monitor lines and therefore, the overdischarge state of the cell proceeds quickly.

It is desirable in one aspect of the present disclosure to sufficiently inhibit discharge from the battery to the cell voltage monitoring circuit when the battery enters the overdischarge state.

One aspect of the present disclosure is a battery device that comprises a battery, a cell voltage monitoring part, a power supply line, a plurality of monitor lines, and an interrupter.

The battery comprises a positive terminal and a plurality of cells in which each cell comprises a positive electrode. The cell voltage monitoring part operates with an electric power from the battery and monitors a cell voltage of each of the plurality of cells. The cell voltage monitoring part compares a value of the cell voltage of each of the plurality of cells with a cell overdischarge threshold and outputs an overdischarge detection signal when at least one value of the values of the cell voltages of the plurality of cells is below the cell overdischarge threshold; the cell overdischarge threshold is a voltage value for determining whether each of the plurality of cells is in an overdischarge state. The power supply line couples the positive terminal of the battery to the cell voltage monitoring part. Each of the plurality of monitor lines corresponds to an individual cell of the plurality of cells, and each of the plurality of monitor lines couples the positive electrode of the individual cell to the cell voltage monitoring part. The interrupter interrupts the power supply line and all of the plurality of monitor lines when the battery enters an overdischarge state.

Here, "overdischarge state" not only means that the entire battery is in the overdischarge state, but also may mean that at least one of the plurality of cells is in the overdischarge state. Accordingly, the interrupter may interrupt the power supply line and all of the monitor lines, for example, when the entire battery enters the overdischarge state and/or when at least one of the plurality of cells enters the overdischarge state.

Specific states of the overdischarge state of the entire battery may be appropriately defined, For example, a state where a value of a voltage of the entire battery (hereinafter referred to as "battery voltage") is less than a specified value may be defined as the overdischarge state of the entire battery. Also, for example, a state where a remaining electric energy of the entire battery is less than a specified amount may be defined as the overdischarge state of the entire battery.

In addition, specific states of the overdischarge state of the cell may be appropriately defined. For example, a state where a value of the cell voltage is less than a specified value may be defined as the overdischarge state of the cells. Also, for example, a state where a remaining electric energy of the cell is less than a specified amount may be defined as the overdischarge state of the cell.

The term "interrupt/interruption" used herein is not limited to mean that the power supply line and all of the monitor lines are physically and completely disconnected; rather, the term "interrupt/interruption" may mean that the power supply line and all of the monitor lines become electrically nonconductive due to, for example, turning off of a semiconductor switching element.

In the battery device configured as described above, when the battery enters the overdischarge state, the interrupter interrupts the power supply line and all of the monitor lines, which interrupts all electrical couplings/connections between the battery and the cell voltage monitoring part. For this reason, an electric current is inhibited from flowing from the battery to the cell voltage monitoring part, or an amount of the electric current flowing from the battery to the cell voltage monitoring part is significantly reduced.

Thus, when the battery enters the overdischarge state, discharge from the battery to the cell voltage monitoring part can be sufficiently inhibited. Because of this, it is possible to sufficiently inhibit development of the overdischarge state of the battery.

The interrupter may comprise a power supply line interruption switch, a plurality of monitor line interruption switches, and a switch driver. The power supply line interruption switch is provided on the power supply line and conducts or interrupts the power supply line. Each of the plurality of monitor line interruption switches corresponds to an individual monitor line of the plurality of monitor lines, and each of the plurality of monitor line interruption switches is provided on the individual monitor line so as to conduct or interrupt the individual monitor line. The switch driver interrupts the power supply line by the power supply line interruption switch and interrupts all of the plurality of monitor lines by all of the plurality of monitor line interruption switches when the battery enters the overdischarge state.

In the battery device configured as described above, the power supply line and the plurality of monitor lines can be efficiently conducted or interrupted with a simple configuration.

The plurality of cells may be serially coupled to one another and may comprise a highest cell having a highest electric potential. In this case, the battery device may further comprise a common line comprising a first end and a second end; the first end is coupled to the positive electrode of the highest cell, and the second end is coupled to the power supply line and a highest monitor line of the plurality of monitor lines, in which the highest monitor line corresponds to the highest cell. The plurality of monitor line interruption switches may comprise a highest monitor line interruption switch corresponding to the highest cell, and the highest monitor line interruption switch may be provided on the common line and further function as the power supply line interruption switch.

In this case, it is not necessary to provide one of the plurality of monitor line interruption switches separately from the power supply line interruption switch with respect to the positive electrode of the highest cell. This facilitates downsizing and cost reduction of the battery device.

Each of the plurality of cells may be configured to be rechargeable. The battery device may be configured to be coupled to a charger that charges the battery. The interrupter may further conduct the power supply line and all of the plurality of monitor lines when the battery device is coupled to the charger.

Alternatively, the battery device may be configured such that a charger coupling signal is inputted to the battery device from the charger when the battery device is coupled to the charger. In this case, the switch driver may further conduct the power supply line by the power supply line interruption switch and conduct all of the plurality of monitor lines by all of the plurality of monitor line interruption switches regardless of whether the battery is in the overdischarge state, when the charger coupling signal is inputted from the charger to the battery device.

In the battery device configured as described above, even though the battery is in the overdischarge state where the power supply line and all of the plurality of monitor lines are interrupted, the power supply line and all of the plurality of monitor lines are conducted when the battery is charged by the charger. As a result, the battery can be charged while operating the cell voltage monitoring part.

In this regard, a configuration in which the power supply line and all of the plurality of monitor lines are conducted when the charging is performed is especially effective, for example, in a case where the cell voltage monitoring part comprises a function of detecting overcharge of each of the plurality of cells. The cell voltage monitoring part cannot detect overcharging of each of the plurality of cells, when the power supply line and all of the plurality of monitor lines remain being interrupted even though the charger starts charging after the power supply line and all of the plurality of monitor lines are interrupted due to detection of the overdischarge state of the battery. In contrast, with the aforementioned configuration, when the charger starts charging, the power supply line and all of the plurality of monitor lines are conducted and therefore, the battery can be charged while operating the cell voltage monitoring part to perform the aforementioned overcharge detecting function.

The interrupter may comprise an overdischarge determiner configured to determine whether the battery is in the overdischarge state. In this case, the switch driver may interrupt the power supply line by the power supply line interruption switch and interrupt all of the plurality of monitor lines by all of the plurality of monitor line interruption switches when the overdischarge determiner determines that the battery is in the overdischarge state.

In the battery device configured as described above, the overdischarge determiner provided separately from the cell voltage monitoring part determines whether the battery is in the overdischarge state, Based on the determination results, the power supply line and all of the plurality of monitor lines are interrupted. Therefore, conditions of interrupting the power supply line and all of the plurality of monitor lines, in other words, references for determination of the overdischarge state of the battery, can be specified in any manner.

In the above-described case where the interrupter comprises the overdischarge determiner, the overdischarge determiner may determine that the battery is in the overdischarge state when a voltage value of the battery is less than a battery overdischarge threshold. The battery overdischarge threshold is a voltage value for determining whether the battery is in the overdischarge state.

In the battery device configured as described above, it can be easily and promptly determine based on the voltage value of the battery whether the battery is in the overdischarge state, i.e., whether to interrupt the power supply line and all of the plurality of monitor lines.

In this case, the battery overdischarge threshold may be appropriately specified. For example, the battery overdischarge threshold may be a value lower than a value obtained by multiplying the cell overdischarge threshold with the number of the plurality of cells.

In the battery device configured as described above, if discharge of the battery proceeds, the cell voltage monitoring part can determine that at least any one of the plurality of cells is in the overdischarge state before the overdischarge determiner determines that the battery is in the overdischarge state. Accordingly, for example, in a case where a load apparatus is coupled to the battery device and an electric power of the battery is supplied to the load apparatus, if discharge of the battery proceeds, firstly, the cell voltage monitoring part outputs the overdischarge detection signal, thereby stopping consumption of the electric power by the load apparatus and thereafter, if the discharge of the battery proceeds further, the interrupter is operated, thereby enabling interruption of the power supply line and all of the plurality of monitor lines.

Alternatively, the cell voltage monitoring part may output the overdischarge detection signal to the switch driver. In this case, the switch driver may interrupt the power supply line by the power supply line interruption switch and interrupt all of the plurality of monitor lines by all of the plurality of monitor line interruption switches when the overdischarge detection signal is inputted to the switch driver from the cell voltage monitoring part.

In the battery device configured as described above, the interrupter can determine whether to interrupt the power supply line and all of the plurality of monitor lines based on the overdischarge detection signal from the cell voltage monitoring part. Thus, configuration of the interrupter can be simplified.

The power supply line interruption switch may conduct the power supply line when the power supply line interruption switch is turned on, and interrupt the power supply line when the power supply line interruption switch is turned off. In this case, the switch driver may turn off the power supply line interruption switch so as to interrupt the power supply line.

Each of the plurality of monitor line interruption switches may conduct the individual monitor line when each of the plurality of monitor line interruption switches is turned on, and interrupt the individual monitor line when each of the plurality of monitor line interruption switches is turned off. In this case, the switch driver may turn off all of the plurality of monitor line interruption switches so as to interrupt all of the plurality of monitor lines.

The plurality of monitor line interruption switches may comprise the highest monitor line interruption switch corresponding to the highest cell, and remaining at least one monitor line interruption switch.

In this case, the remaining at least one monitor line interruption switch may comprise a P-channel FET and an N-channel FET coupled in parallel to each other. The P-channel FET may comprise a source and a drain. The source of the P-channel FET is coupled to the positive electrode of at least one cell of the plurality of cells, wherein the at least one cell corresponds to the remaining at least one monitor line interruption switch, and is also coupled to a drain of the N-channel FET, The drain of the P-channel FET is coupled to the cell voltage monitoring part and a source of the N-channel FET.

The switch driver may turn on the P-channel FET and the N-channel FET of the remaining at least one monitor line interruption switch when interrupting all of the plurality of monitor lines.

The switch driver may apply a first voltage, which is a divided voltage of a voltage of the positive electrode of the at least one cell, between a gate of the P-channel FET and the source of the P-channel FET so as to turn on the P-channel FET. The switch driver may apply a second voltage, which is a divided voltage of a voltage difference between a voltage of the battery and the voltage of the positive electrode of the at least one cell, between the source of the N-channel FET and a gate of the N-channel FET so as to turn on the N-channel FET.

In the battery device configured as described above, there may be a following case: for example, a cell voltage of one cell having a lowest electric potential among the plurality of cells is so low that the P-channel FET of the monitor line interruption switch corresponding to this one cell cannot be turned on; even in this case, if the voltage of the battery is sufficient to turn on the N-channel FET, the N-channel FET is turned on, allowing to turn on the monitor line interruption switch. That is, as long as the voltage of the battery is sufficient to turn on the N-channel FET, the P-channel FETs and/or the N-channel FETS of the plurality of monitor line interruption switches can be turned on regardless of the cell voltages of the cells.

Another aspect of the present disclosure is a method of protecting a battery device from overdischarge. The battery device comprises: a battery comprising a positive terminal and a plurality of cells, in which each cell comprises a positive electrode; a cell voltage monitoring part configured to operate with an electric power from the battery and monitor a cell voltage of each of the plurality of cells; a power supply line that couples the positive terminal of the battery to the cell voltage monitoring part; and a plurality of monitor lines, each of which corresponds to an individual cell of the plurality of cells, and each of which couples the positive electrode of the individual cell to the cell voltage monitoring part.

The method comprises: comparing a value of the cell voltage of each of the plurality of cells with a cell overdischarge threshold by the cell voltage monitoring part, in which the cell overdischarge threshold is a voltage value for determining whether each of the plurality of cells is in an overdischarge state; outputting an overdischarge detection signal from the cell voltage monitoring part when at least one value of the values of the cell voltages of the plurality of cells is below the cell overdischarge threshold; interrupting the power supply line when the battery enters an overdischarge state; and interrupting all of the plurality of monitor lines when the battery enters the overdischarge state.

This method can exhibit the same effects as those obtained by the above-described battery device.

Still another aspect of the present disclosure is a method of protecting a battery device from overdischarge. The battery device comprises: a battery comprising a positive terminal and a plurality of cells, in which each cell comprises a positive electrode; a cell voltage monitoring part configured to operate with an electric power from the battery and monitor a cell voltage of each of the plurality of cells; a power supply line that couples the positive terminal of the battery to the cell voltage monitoring part; and a plurality of monitor lines, each of which corresponds to an individual cell of the plurality of cells, and each of which couples the positive electrode of the individual cell to the cell voltage monitoring part.

The method comprises: configuring the cell voltage monitoring part such that the cell voltage monitoring part compares a value of the cell voltage of each of the plurality of cells with a cell overdischarge threshold and outputs an overdischarge detection signal when at least one value of the values of the cell voltages of the plurality of cells is below the cell overdischarge threshold, in which the cell overdischarge threshold is a voltage value for determining whether each of the plurality of cells is in an overdischarge state; providing a power supply line interruption switch on the power supply line in which the power supply line interruption switch is configured to interrupt the power supply line when the battery enters an overdischarge state; and providing a plurality of monitor line interruption switches, respectively, on the plurality of monitor lines in which each of the plurality of monitor line interruption switches corresponds to an individual monitor line of the plurality of monitor lines, and each of the plurality of monitor line interruption switches is configured to interrupt the individual monitor line when the battery enters the overdischarge state.

This method can also exhibit the same effects as those obtained by the above-described battery device.

BRIEF DESCRIPTION OF THE DRAWINGS

Example embodiments of the present disclosure will be described hereinafter by way of example with reference to the accompanying drawings, in which.

DETAILED DESCRIPTION OF THE PREFERRED EMBODIMENTS

First Embodiment (1) Configuration of a Battery Pack

Figure 1:
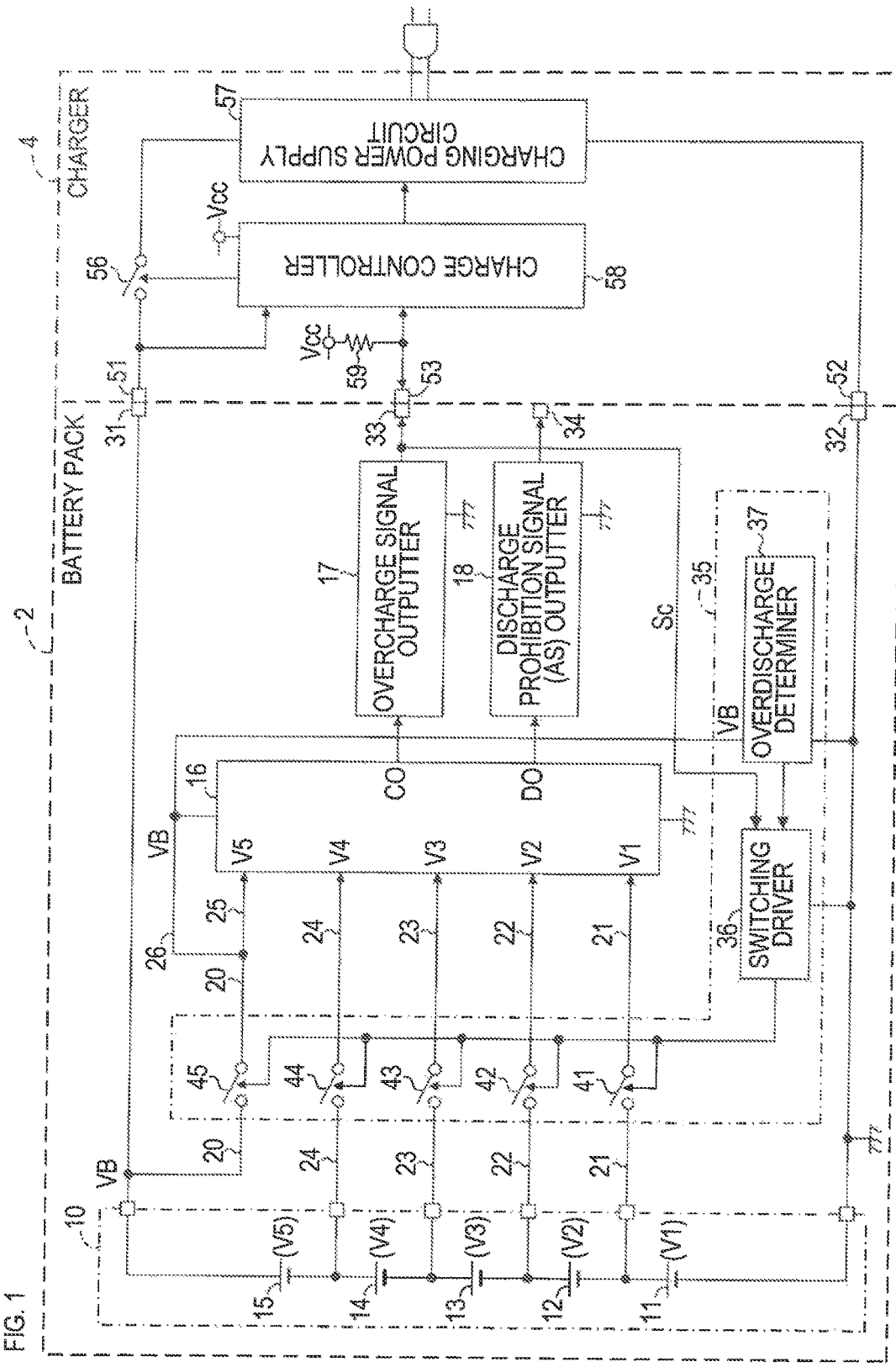
FIG. 1 is an explanatory diagram showing a state where a battery pack of a first embodiment is attached to a charger.
Figure 2:
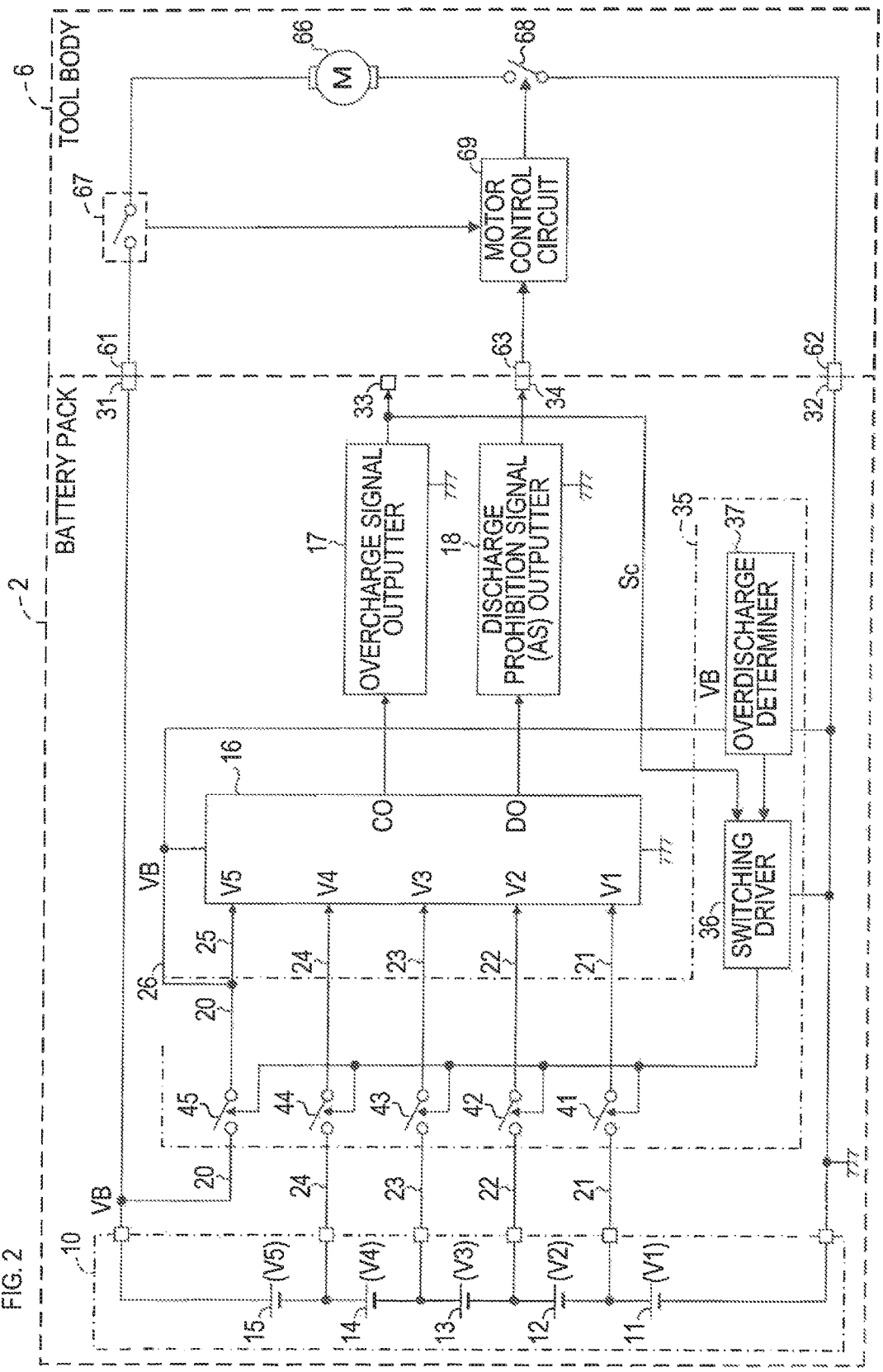
FIG. 2 is an explanatory diagram showing a state where the battery pack of the first embodiment is attached to a tool body.

With reference to FIGS. 1 and 2, a configuration of a battery pack 2 of the present embodiment will be described.

The battery pack 2 comprises a battery 10, a cell-voltage monitoring circuit 16, an overcharge signal outputter 17, a discharge prohibition signal outputter 18, an interrupter 35, a positive terminal 31, a negative terminal 32, a first signal terminal 33, and a second signal terminal 34.

The battery 10 comprises serially-coupled cells. In the present embodiment, the battery 10 comprises a first cell 11, a second cell 12, a third cell 13, a fourth cell 14, and a fifth cell 15, which are serially coupled to one another.

Each of the cells 11 to 15 is a repeatedly rechargeable battery and in the present embodiment, for example, is a lithium-ion rechargeable battery cell. A value of a nominal voltage of each of the cells 11 to 15 is, for example, 3.7 V. When being charged, each of the cells 11 to 15 is charged to reach a target voltage value of, for example, 4.1 V or 4.2 V, for example, using a CCCV charging method. It is merely one example that each of the cells 11 to 15 is a lithium-ion rechargeable battery cell. Also, the aforementioned value of the nominal voltage and the aforementioned charging method are merely one example.

The battery 10 can be charged by a charger 4. The charger 4 comprises a charge switch 56, a charging power supply circuit 57, and a charge controller 58. The charging power supply circuit 57 generates, based on an electric power externally inputted thereto, charging direct-current power (hereinafter referred to as "charging power") and outputs the generated charging power via a positive terminal 51 and a negative terminal 52. In the present embodiment, for example, a commercial alternating current power of alternating current 100 V is inputted to the charging power supply circuit 57, and the charging power supply circuit 57 converts the commercial alternating current power into the charging power and outputs the charging power.

The charge switch 56 is provided on a line for outputting the charging power, which extends between the charging power supply circuit 57 and the positive terminal 51. The charge switch 56 conducts or interrupts this line.

The charge controller 58 controls operations of the charging power supply circuit 57 and the charge switch 56. In a case where the charger 4 is attached to the battery pack 2 and it is possible to charge the battery 10, the charge controller 58 causes the charging power supply circuit 57 to generate the charging power and turns on the charge switch 56, so as to output the charging power to the battery pack 2. Consequently, the charging power is supplied to the battery 10 inside the battery pack 2, thereby charging the battery 10.

In addition to the function of generating the charging power, the charging power supply circuit 57 also has a function of generating a direct-current power supply voltage Vcc for operating parts provided in the charger 4. A value of the power supply voltage Vcc can be specified appropriately; in the present embodiment, the power supply voltage Vcc is, for example, 5 V. The parts provided in the charger 4, including the charge controller 58, operate with the power supply voltage Vcc as a power source.

The charger 4 comprises a signal terminal 53. The signal terminal 53 is coupled to the charge controller 58. The power supply voltage Vcc is applied to the signal terminal 53 via a resistor 59 (in other words, the resistor 59 pulls an output of the signal terminal 53 to the power source voltage Vcc). When the battery pack 2 is attached to the charger 4, the signal terminal 53 is coupled to the first signal terminal 33 of the battery pack 2. An overcharge signal is inputted to the signal terminal 53 from the battery pack 2. The charge controller 58 turns off the charge switch 56 to stop the charging of the battery 10 when the overcharge signal is inputted to the signal terminal 53 from the battery pack 2 during charging of the battery 10.

As shown in FIG. 2, when a user attaches the battery pack 2 to a tool body 6, battery power, which is electric power of the battery 10, is supplied from the battery pack 2 to the tool body 6, thereby operating the tool body 6. What is configured at least with the tool body 6 and the battery pack 2 is an on-site electric apparatus. The on-site electric apparatus may include electric apparatuses used at various work sites of, for example, do-it-yourself carpentry, manufacturing, gardening, construction. Specifically, the on-site electric apparatus may be, for example, an electric power tool for masonry work, metalworking, or woodworking, or a working machine for gardening, or an electric apparatus for preparing an environment of a work site. More specifically, the on-site electric apparatus may be, for example, an electric hammer, an electric hammer drill, an electric drill, an electric driver, an electric wrench, an electric grinder, an electric circular saw, an electric reciprocating saw, an electric jigsaw, an electric cutter, an electric chainsaw, an electric plane, an electric nailer (including an electric tacker), an electric hedge trimmer, an electric lawn mower, an electric lawn trimmer, an electric grass cutter, an electric cleaner, an electric blower, an electric sprayer, an electric spreader, an electric dust collector, a work light, or an audio device for work sites, such as a radio and a speaker. When the battery pack 2 is attached to the tool body 6, the tool body 6 can be operated with the battery power supplied from the battery pack 2.

The tool body 6 comprises a motor 66, an operation switch 67, a drive switch 68, and a motor control circuit 69. The motor 66 is a driving source for allowing the tool body 6 to achieve its function. For example, if the tool body 6 is a tool body of a driver drill, a not-shown tool bit provided in the tool body is rotated by the motor 66, allowing drilling operations.

When the battery pack 2 is attached to the tool body 6, the battery power is inputted from the battery pack 2 to the motor 66 via a positive terminal 61 and a negative terminal 62. The motor 66 rotates with the battery power inputted from the battery pack 2.

The operation switch 67 and the drive switch 68 are provided on a current conduction path extending from the positive terminal 61 to the negative terminal 62 via the motor 66. When these switches 67 and 68 are turned on, the battery power is supplied to the motor 66. The operation switch 67 is to be turned on or off by the user of the tool body 6. The drive switch 68 is to be turned on or off by the motor control circuit 69.

When the operation switch 67 is turned on, the motor control circuit 69 turns on the drive switch 68 to rotate the motor 66. The motor control circuit 69 may make the drive switch 68 be continuously on while the operation switch 67 is on. Also, the motor control circuit 69 may operate the drive switch 68 with a duty ratio depending on an operation amount of the operation switch 67.

A discharge prohibition signal AS is inputted to the motor control circuit 69 from the battery pack 2 via a signal terminal 63. The motor control circuit 69 turns off the drive switch 68, thereby stopping the rotation of the motor 66 when the discharge prohibition signal AS is inputted to the motor control circuit 69 during rotation of the motor 66.

In the battery pack 2, the positive terminal 31 is coupled to a positive electrode of the battery 10 (i.e., a positive electrode of the fifth cell 15), and the negative terminal 32 is coupled to a negative electrode of the battery 10 (i.e., a negative electrode of the first cell 11), Accordingly, through the positive terminal 31 and the negative terminal 32 of the battery pack 2, the battery power can be supplied externally and also, electric power for charging the battery 10 can be received externally, thereby charging the battery 10.

When a fifth interruption switch 45 provided in the interrupter 35 is turned on, the battery power is inputted to the cell-voltage monitoring circuit 16 via the fifth interruption switch 45; in this case, the cell-voltage monitoring circuit 16 operates with the inputted battery power as a power source.

Voltages to be inputted to the cell-voltage monitoring circuit 16 are as follows: a voltage of a positive electrode of the first cell 11 (hereinafter referred to as "first voltage") is inputted via a first monitor line 21; a voltage of a positive electrode of the second cell 12 (hereinafter referred to as "second voltage") is inputted via a second monitor line 22; a voltage of a positive electrode of the third cell 13 (hereinafter referred to as "third voltage") is inputted via a third monitor line 23; a voltage of a positive electrode of the fourth cell 14 (hereinafter referred to as "fourth voltage") is inputted via a fourth monitor line 24; and a voltage of the positive electrode of the fifth cell 15 (hereinafter referred to as "fifth voltage") is inputted via a fifth monitor line 25.

The cell-voltage monitoring circuit 16 monitors, based on the aforementioned first to the fifth voltages, the following voltage values separately from me another: a first cell voltage value V1, which is a voltage value of the first cell 11; a second cell voltage value V2, which is a voltage value of the second cell 12; a third cell voltage value V3, which is a voltage value of the third cell 13; a fourth cell voltage value V4, which is a voltage value of the fourth cell 14; and a fifth cell voltage value V5, which is a voltage value of the fifth cell 15.

Specifically, when at least any one of the cell voltage values V1 to V5 is less than a cell overdischarge threshold (hereinafter referred to as "cell overdischarge state") that is a voltage value for determining whether each of the cells 11 to 15 is in the overdischarge state, the cell-voltage monitoring circuit 16 outputs an overdischarge detection signal DO. When detecting the cell overdischarge state, the cell-voltage monitoring circuit 16 sets a logical state of an output terminal for the overdischarge detection signal DO to be the high impedance state.

A type of output of the overdischarge detection signal DO is, for example, open collector output. When the cell overdischarge state is not detected, a transistor constituting an open collector is turned on, and a logical state of the output terminal for the overdischarge detection signal DO is a Low level (hereinafter referred to as "L-level") having almost the same electric potential as the ground potential. In this state, the overdischarge detection signal DO is not outputted.

On the other hand, when the cell overdischarge state is detected, the transistor constituting the open collector is turned off, and the logical state of the output terminal for the overdischarge detection signal DO is the high impedance state. Specifically, an internal resistance of the cell-voltage monitoring circuit 16 is equivalently infinite with respect to the output terminal for the overdischarge detection signal DO. Therefore, in the present embodiment, "the overdischarge detection signal DO is outputted" means that the logical state of the output terminal for the overdischarge detection signal DO is the high impedance state.

The cell overdischarge threshold may be, for example, specified with a value lower than a value of the nominal voltage. In the present embodiment, the cell overdischarge threshold is, for example, 2.5 V. Accordingly, if at least any one of the cell voltage values V1 to V5 becomes less than 2.5 V, the cell-voltage monitoring circuit 16 detects the cell overdischarge state and outputs the overdischarge detection signal DO.

The overdischarge detection signal DO outputted from the cell-voltage monitoring circuit 16 is inputted to the discharge prohibition signal outputter 18. The discharge prohibition signal outputter 18 outputs the discharge prohibition signal AS when the overdischarge detection signal DO is outputted from the cell-voltage monitoring circuit 16. The discharge prohibition signal AS is outputted from the second signal terminal 34 to outside of the battery pack 2. Therefore, in a case where the battery pack 2 is, for example, attached to the tool body 6 as shown in FIG. 2, the discharge prohibition signal AS outputted from the discharge prohibition signal outputter 18 is inputted to the tool body 6 via the second signal terminal 34.

Moreover, when at least any one of the cell voltage values V1 to V5 is equal to or greater than an overcharge threshold (hereinafter referred to as "overcharge state"), the voltage monitoring circuit 16 outputs an overcharge detection signal CO. Specifically, when the overcharge state does not occur, the cell-voltage monitoring circuit 16 sets a logical state of an output terminal for the overcharge detection signal CO to be L-level.

On the other hand, when detecting the overcharge state, the cell-voltage monitoring circuit 16 sets the logical state of the output terminal for the overcharge detection signal CO to be a High level (hereinafter referred to as "H-level") having a voltage larger by a specified voltage (e.g., 5 V) than the around potential. Accordingly, in the present embodiment, "the overcharge detection signal CO is outputted" means that a voltage with H-level in the logical state is outputted from the output terminal for the overcharge detection signal CO.

The overcharge detection signal CO outputted from the cell-voltage monitoring circuit 16 is inputted to the overcharge signal outputter 17. The overcharge, signal outputter 17 outputs, from an output terminal thereof, the overcharge signal with L-level when the overcharge detection signal CO is outputted from the cell-voltage monitoring circuit 16. However, when the overcharge detection signal CO is not outputted from the cell-voltage monitoring circuit 16, the overcharge signal outputter 17 does not output the overcharge signal and sets a logical state of the output terminal thereof to be the high impedance state.

The output terminal of the overcharge signal outputter 17 is coupled to the first signal terminal 33. When the battery pack 2 is attached to the charger 4, the first signal terminal 33 of the battery pack 2 is coupled to the signal terminal 53 of the charger 4.

In a case where at least the power supply voltage Vcc is generated in the charger 4 to which the battery pack 2 is attached and the overcharge signal is not outputted from the overcharge signal outputter 17, in other words, the logical state of the output terminal of the overcharge signal outputter 17 is the high impedance state, the power supply voltage Vcc of the charger 4 is applied to the first signal terminal 33. In this case, the power supply voltage Vcc of the charger 4 is inputted, as a charger coupling signal Sc, via the first signal terminal 33 to a switching driver 36 provided in the interrupter 35.

The interrupter 35 comprises a first interruption switch 41, a second interruption switch 42, a third interruption switch 43, a fourth interruption switch 44, and the aforementioned fifth interruption switch 45. The interruption switches 41 to 45 are turned on or off by the switching driver 36.

The first interruption switch 41 is provided on the first monitor line 21. The first monitor line 21 is a line for inputting the first voltage to the cell-voltage monitoring circuit 16. When the first interruption switch 41 is turned off, the first monitor line 21 is interrupted and therefore, the first voltage from the first cell 11 is not inputted to the cell-voltage monitoring circuit 16. However, when the first interruption switch 41 is turned on, the first monitor line 21 is conducted and therefore, the first voltage from the first cell 11 is inputted via the first monitor line 21 to the cell-voltage monitoring circuit 16.

The second interruption switch 42 is provided on the second monitor line 22. The second monitor line 22 is a line for inputting the second voltage to the cell-voltage monitoring circuit 16. When the second interruption switch 42 is turned off, the second monitor line 22 is interrupted and therefore, the second voltage from the second cell 12 is not inputted to the cell-voltage monitoring circuit 16. However, when the second interruption switch 42 is turned on, the second monitor line 22 is conducted and therefore, the second voltage from the second cell 12 is inputted via the second monitor line 22 to the cell-voltage monitoring circuit 16.

The third interruption switch 43 is provided on the third monitor line 23. The third monitor line 23 is a line for inputting the third voltage to the cell-voltage monitoring circuit 16. When the third interruption switch 43 is turned off, the third monitor line 23 is interrupted and therefore, the third voltage from the third cell 13 is not inputted to the cell-voltage monitoring circuit 16. However, when the third interruption switch 43 is turned on, the third monitor line 23 is conducted and therefore, the third voltage from the third cell 13 is inputted via the third monitor line 23 to the cell-voltage monitoring circuit 16.

The fourth interruption switch 44 is provided on the fourth monitor line 24. The fourth monitor line 24 is a line for inputting the fourth voltage to the cell-voltage monitoring circuit 16. When the fourth interruption switch 44 is turned off, the fourth monitor line 24 is interrupted and therefore, the fourth voltage from the fourth cell 14 is not inputted to the cell-voltage monitoring circuit 16. However, when the fourth interruption switch 44 is turned on, the fourth monitor line 24 is conducted and therefore, the fourth voltage from the fourth cell 14 is inputted via the fourth monitor line 24 to the cell-voltage monitoring circuit 16.

The fifth interruption switch 45 is provided on a highest common line 20. A first end of the highest common line 20 is coupled to the positive electrode of the battery 10. A second end of the highest common line 20 is branched into the fifth monitor line 25 and a power supply line 26, both of which are coupled to the cell-voltage monitoring circuit 16.

The fifth monitor line 25 is a line for inputting the fifth voltage to the cell-voltage monitoring circuit 16. The power supply line 26 is a line for supplying, as a source power for operation, the battery power having a battery voltage VB to the cell-voltage monitoring circuit 16. The highest common line 20 is a line serving as both the fifth monitor line 25 and the power supply line 26.

Accordingly, when the fifth interruption switch 45 is turned off, the highest common line 20 is interrupted, which consequently interrupts both the fifth monitor line 25 and the power supply line 26. In this case, the fifth voltage from the fifth cell 15 is not inputted via the fifth monitor line 25 to the cell-voltage monitoring circuit 16; also, the battery power for operation is not inputted via the power supply line 26 to the cell-voltage monitoring circuit 16.

On the other hand, when the fifth interruption switch 45 is turned on, the highest common line 20 is conducted and thus, both the fifth monitor line 25 and the power supply line 26 are conducted. In this case, the fifth voltage from the fifth cell 15 is inputted via the fifth monitor line 25 to the cell-voltage monitoring circuit 16 and also, the battery power is inputted via the power supply line 26 to the cell-voltage monitoring circuit 16.

Accordingly, the fifth interruption switch 45 provided on the highest common line 20 has a function of conducting and interrupting the fifth monitor line 25 and a function of conducting and interrupting the power supply line 26.

The power supply line 26 is coupled, not only to the cell-voltage monitoring circuit 16, but also to an overdischarge determiner 37 provided in the interrupter 35. Accordingly, the battery voltage VB is inputted to the overdischarge determiner 37.

The interrupter 35 comprises the aforementioned switching driver 36 and the aforementioned overdischarge determiner 37. The switching driver 36 turns on or off the interruption switches 41 to 45.

The battery voltage VB of the battery 10 is inputted to the overdischarge determiner 37; the overdischarge determiner 37 operates with the battery voltage VB as a power source. The overdischarge determiner 37 determines whether the battery 10 is in an overdischarge state. Specifically, the overdischarge determiner 37 determines that the battery 10 is in the overdischarge state (hereinafter referred to as "battery overdischarge state") when a value of the battery voltage VB (hereinafter referred to as "battery voltage value"), which is a voltage of the entire battery 10, is less than a battery overdischarge threshold.

When the battery 10 is in the battery overdischarge state, the overdischarge determiner 37 causes the switching driver 36 to turn off all of the interruption switches 41 to 45. On the other hand, when the battery 10 is not in the overdischarge state, the overdischarge determiner 37 causes the switching driver 36 to turn on all of the interruption switches 41 to 45.

A value of the battery overdischarge threshold may be specified appropriately. In the present embodiment, the battery overdischarge threshold may be specified with a value lower than a value obtained by multiplying the cell overdischarge threshold, which is specified in the cell-voltage monitoring circuit 16, with the number of cells. In the cell-voltage monitoring circuit 16, as described above, the cell overdischarge threshold is, for example, 2.5 V. By multiplying this cell overdischarge threshold of 2.5 V with 5, which is the number of cells, a voltage of 12.5 V is obtained. Accordingly, the value of the battery overdischarge threshold is specified to be lower than 1.2.5 V. In the present embodiment, the battery overdischarge threshold is, for example, 11 V.

In view of the aforementioned, if the battery 10 is further discharged, the cell-voltage monitoring circuit 16 detects the cell overdischarge state before determination of the battery overdischarge state by the overdischarge determiner 37. In other words, at the time when the battery overdischarge state is determined by the overdischarge determiner 37, the cell overdischarge state has been already detected by the cell-voltage monitoring circuit 16.

The switching driver 36 is configured such that the charger coupling signal Sc is inputted to the switching driver 36 from the charger 4 when the battery pack 2 is attached to the charger 4. The switching driver 36 turns off all of the interruption switches 41 to 45 when the overdischarge determiner 37 determines that the battery overdischarge state occurs. Thereafter, when the battery pack 2 is attached to the charger 4 and the charger coupling signal Sc is inputted to the switching driver 36 from the charger 4, the switching driver 36 turns on all of the interruption switches 41 to 45.

(2) Detailed Configuration of the Interrupter

Figure 3:
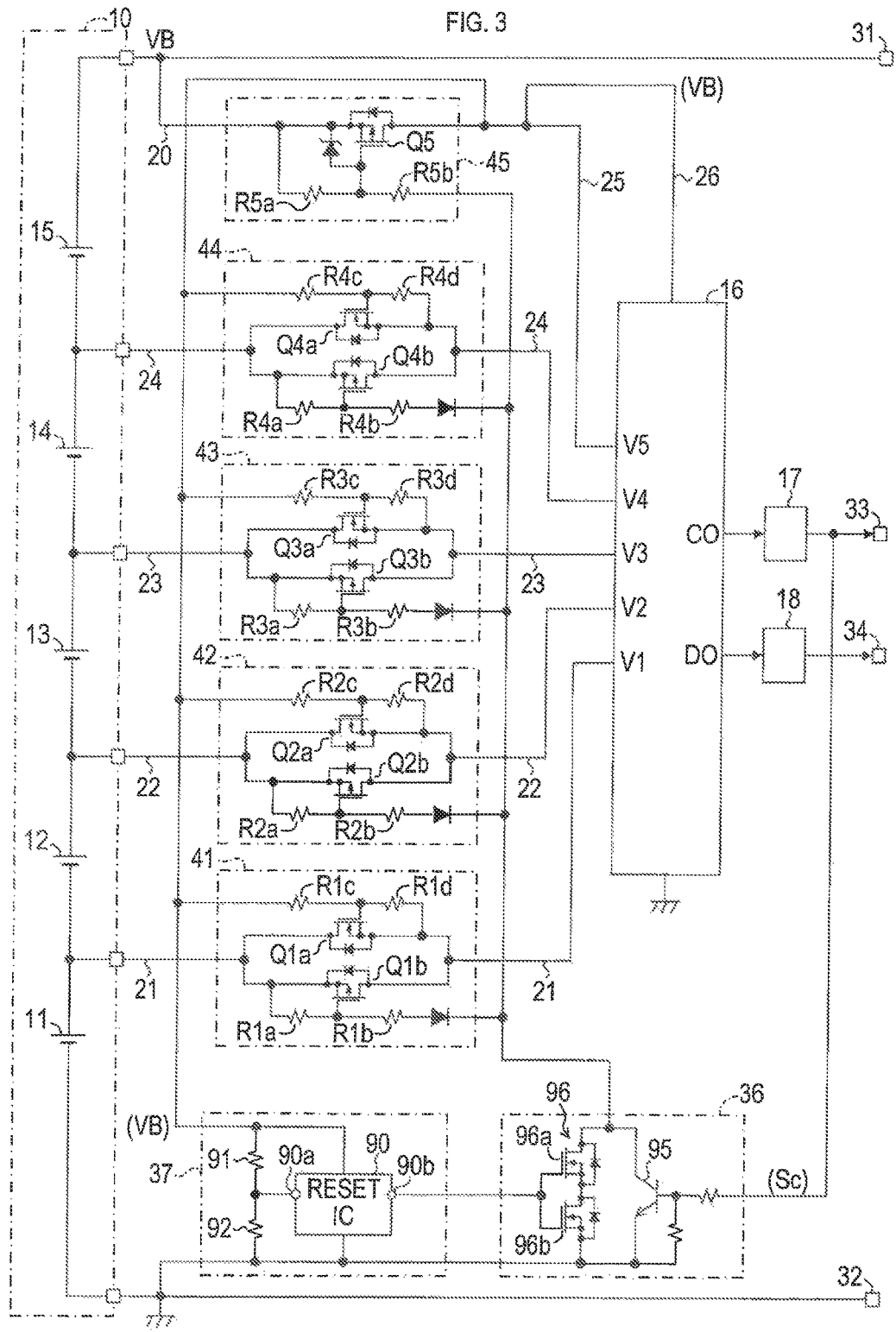
FIG. 3 is a circuit diagram showing a detailed circuit configuration of the battery pack of the first embodiment.

With reference to FIG. 3, more detailed circuit configurations of the interruption switches 41 to 45, the switching driver 36, and the overdischarge determiner 37 in the interrupter 35 will be described.

In the descriptions hereinafter, a line that couples the interruption switches 41 to 45 to the switching driver 36 is also referred to as "switch control line". In order to turn off the interruption switches 41 to 45, the switching driver 36 causes a logical state of a coupling terminal of the switch control line (hereinafter referred to as "switch control terminal") in the switching driver 36 to be the high-impedance state. On the other hand, in order to turn on the interruption switches 41 to 45, the switching driver 36 causes a logical state of the switch control terminal to be L-level.

The fifth interruption switch 45 comprises a P-channel FET Q5 (hereinafter referred to as "FET Q5"), The FET Q5 is provided on the highest common line 20. The highest common line 20 is conducted and interrupted by the FET Q5. A source of the FET Q5 is coupled to the positive electrode of the fifth cell 15 the positive electrode of the battery 10). A drain of the FET Q5 is coupled to the cell-voltage monitoring circuit 16 via both the fifth monitor line 25 and the power supply line 26. In addition, the drain of the FET Q5 is coupled to the overdischarge determiner 37 and also to the first to fourth interruption switches 41 to 44.

A resistor R5a is coupled between a gate and the source of the FET Q5. The gate of the FET Q5 is coupled to the switch control line via a resistor R5b. Accordingly, when the logical state of the switch control terminal of the switching driver 36 is the high-impedance state, the FET Q5 is turned off and thus, the fifth interruption switch 45 is turned off. On the other hand, when the logical state of the switch control terminal of the switching driver 36 enters L-level, among divided voltages obtained by dividing the battery voltage VB with the resistors R5a and R5b, the divided voltage obtained with the resistor R5a is applied between the gate and the source of the FET Q5. As a result, the FET Q5 is turned on.

The first to fourth interruption switches 41 to 44 all have the same physical configuration and the same function. For this reason, the configuration of the first interruption switch 41 will be described as a representative example, and the configurations of the second to fourth interruption switches 42 to 44 will not be provided herein.

The first interruption switch 41 comprises a P-channel FET Q1b (hereinafter referred to as "FET Q1b") and an N-channel FET Q1a (hereinafter referred to as "FET Q1a") that are coupled in parallel to each other. A source of the FET Q1b is coupled to the positive electrode of the first cell 11 and also to a drain of the FET Q1a. A drain of the FET Q1b is coupled to the cell-voltage monitoring circuit 16 and also to the source of the FET Q1a.

A resistor R1a is coupled between a gate and the source of the FET Q1b. Also, the gate of the FET Q1b is coupled to the switch control line via a resistor R1b and a diode. A resistor R1d is coupled between a gate and the source of the FET Q1a. The gate of the FET Q1a is coupled to the highest common line 20 via a resistor R1c (specifically, coupled to a downstream side of the fifth interruption switch 45).

Accordingly, when the logical state of the switch control terminal of the switching driver 36 is the high-impedance state, both the FET Q1b and the FET Q1a are turned off and therefore, the first interruption switch 41 is turned off. On the other hand, when the logical state of the switch control terminal of the switching driver 36 enters L-level, among divided voltages obtained by dividing the first voltage with the resistors R1a and R1b, the divided voltage obtained with the resistor R1a is applied between the gate and the source of the FET Q1b. As a result, the FET Q1b is turned on and therefore, the first interruption switch 41 is turned on.

When the logical state of the switch control terminal of the switching driver 36 enters L-level, the fifth interruption switch 45 is also turned on; thus, the battery voltage VB is inputted to the first interruption switch 41 via the fifth interruption switch 45. Therefore, when a voltage difference between the battery voltage VB and the voltage of the positive electrode of the first cell 11 is equal to or greater than a minimum voltage necessary for turning on the FET Q1a, the FET Q1a is also turned on.

In the descriptions herein, as for the first to fourth interruption switches 41 to 44, turning "on" of the switch means that at least one of the P-channel FET and the N-channel FET is turned on, and turning "off" of the switch means that both of the P-channel FET and the N-channel FET are turned off.

The overdischarge determiner 37 comprises a reset IC 90. The reset IC 90 operates with, as a power source, the battery voltage VB inputted via the fifth interruption switch 45. Inputted as information indicating the battery voltage VB to an input terminal 90a of the reset IC 90 is a voltage obtained by dividing the battery voltage VB with the resistors 91 and 92.

The reset IC 90 detects, based on the voltage inputted to the input terminal 90a, whether the battery voltage value is equal to or greater than the battery overdischarge threshold. When the battery voltage value is equal to or greater than the battery overdischarge threshold, the reset IC 90 outputs a signal in a logical state of H-level (for example, a voltage of 5 V) from an output terminal 90b. On the other hand, when the battery voltage value is less than the battery overdischarge threshold and the battery overdischarge state occurs, the reset IC 90 outputs a signal in a logical state of L-level from the output terminal 90b.

The switching driver 36 comprises a first driver 96 and a second driver 95. The first driver 96 comprises an N-channel FET 96a (hereinafter referred to as "FET 96a") and an N-channel FET 96b (hereinafter referred to as "FET 96b") that are serially coupled to each other, The output signal from the reset IC 90 is inputted to respective gates of the FET 96a and the FET 96b. A drain of the FET 96a on a high side is coupled to the switch control line. A source of the FET 96b on a low side is coupled to the negative terminal 32.

In view of the aforementioned, when the battery overdischarge state is not detected in the reset IC 90 and the logical state of the output signal of the reset IC 90 is H-level, both the FET 96a and FET 96b of the first driver 96 in the switching driver 36 are turned on, thereby causing the logical state of the switch control terminal of the switching driver 36 to be L-level. Consequently, the interruption switches 41 to 45 are all turned on.

On the other hand, when the battery overdischarge state is detected in the reset IC 90 and the logical state of the output signal of the reset IC 90 is L-level, both the FET 96a and FET 96b of the first driver 96 in the switching driver 36 are turned off, thereby causing the logical state of the switch control terminal of the switching driver 36 to be the high-impedance state. Consequently, the interruption switches 41 to 45 are all turned off. When all of the interruption switches 41 to 45 are turned off, the supply of the battery power to the cell-voltage monitoring circuit 16 is interrupted, thereby stopping the operation of the cell-voltage monitoring circuit 16; in addition, the input of the respective voltages through the monitor lines 21 to 25 to the cell-voltage monitoring circuit 16 is interrupted.

When the operation of the cell-voltage monitoring circuit 16 is stopped, the logical state of the output terminal for the overdischarge detection signal DO in the cell-voltage monitoring circuit 16 is maintained to be the high-impedance state. When the fifth interruption switch 45 is turned off, the input of the battery voltage VB to the reset IC 90 is also interrupted, thereby causing the reset IC 90 to stop its operation, While the operation of the reset IC 90 is stopped, the logical state of the output terminal 90b of the reset IC 90 is L-level. Accordingly, the first driver 96 of the switching driver 36 is maintained to be off, thereby maintaining the interruption switches 41 to 45 to be off.

When the battery overdischarge state occurs, the battery pack 2 is attached to the charger 4, thereby enabling charging of the battery 10. When the battery pack 2 is attached to the charger 4, the power supply voltage Vcc in the charger 4 is inputted, as the charger coupling signal Sc, to the switching driver 36 via the first signal terminal 33 as described above. Specifically, the charger coupling signal Sc is inputted to the second driver 95.

In the present embodiment, the second driver 95 comprises at least an NPN bipolar transistor. Specifically, a collector of the bipolar transistor is coupled to the switch control line, and an emitter of the bipolar transistor is coupled to the negative terminal 32. The charger coupling signal Sc is inputted to a base of the bipolar transistor.

When the charger coupling signal Sc is not inputted to the switching driver 36, the second driver 95 is turned off. However, when the charger coupling signal Sc is inputted to the switching driver 36, the second driver 95 is turned on and thus, the logical state of the switch control terminal of the switching driver 36 is L-level. Consequently, the interruption switches 41 to 45 are turned on.

Accordingly, when the interruption switches 41 to 45 are turned off due to occurrence of the battery overdischarge state, the interruption switches 41 to 45 are turned on again by attaching the battery pack 2 to the charger 4, thereby enabling charging of the battery 10. That is, the battery 10 can be charged, while operating the cell-voltage monitoring circuit 16 normally.

As a result of the charging of the battery 10, the battery voltage value becomes equal to or greater than the battery overdischarge threshold; in this case, the logical state of the output signal of the reset IC 90 is changed to H-level. When the logical state of the output signal of the reset IC 90 is changed to H-level, the first driver 96 in the switching driver 36 is turned on. Therefore, if the battery pack 2 is detached from the charger 4 thereafter, the interruption switches 41 to 45 are maintained to be on.

Next, the reason why the first to fourth interruption switches 41 to 44 comprise not only the P-channel FET but also the N-channel FET will be described.

Depending on conditions of the battery 10, for example, the following case may occur: the second cell 12 is in the overcharge state (for example, 4.5 V), whereas the other four cells 11, 13, 14, and 15 are 0 V (hereinafter, "specific abnormal state"). In this specific abnormal state, a sum (i.e., "battery voltage value") of the cell voltages V1 to V5, respectively, of the first to fifth cells 11 to 15 is 4.5 V, and the battery 10 as a whole is in the battery overdischarge state. Thus, the interruption switches 41 to 45 are all interrupted by the switching driver 36.

If the battery pack 2 is attached to the charger 4 under the aforementioned specific abnormal state, the battery 10 is charged by the charger 4. In this case, although the battery 10 as a whole is in the overdischarge state, the second cell 12 is in the overcharge state. Therefore, it is necessary to stop the charging. Specifically, it is necessary stop supply of the charging power from the charger 4 by making the overcharge signal outputter 17 output the overcharge signal to the charger 4.

In order to allow the cell-voltage monitoring circuit 16 to detect an overcharge state of the cells, all of the monitor lines 21 to 25 need to be conducted, Even if one of the monitor lines 21 to 25 is interrupted, it is difficult to appropriately detect the overcharge state based on each of the cell voltage values V1 to V5. For this reason, when the battery pack 2 is attached to the charger 4 so as to perform charging, all of the interruption switches 41 to 45 need to be turned on, thereby conducting all of the monitor lines 21 to 25.

To illustrate, if each of the first to fourth interruption switches 41 to 44 comprises the P-channel FET only as a switching element, without the N-channel FET, the following would occur: when the battery pack 2 is attached to the charger 4, the second driver 95 of the switching driver 36 is turned on in response to the charger coupling signal Sc from the charger 4, thereby turning on the respective P-channel FETs of the second to fourth interruption switches 42 to 44.

In this case, the FET Q5 of the fifth interruption switch 45 is also turned on. Consequently, the battery power is supplied to the cell-voltage monitoring circuit 16, which causes the cell-voltage monitoring circuit 16 to start operating.

As described above, when the battery pack 2 is attached to the charger 4 in the specific abnormal state, the respective P-channel FETs of the second to fifth interruption switches 42 to 45 are turned on again. However, the P-channel FET of the first interruption switch 41 is not turned on because the first cell voltage value V1 of the first cell 11 is 0 V. Consequently, the first monitor line 21 is not conducted and remains interrupted, and the cell-voltage monitoring circuit 16 cannot monitor the first cell voltage value V1.

In view of the aforesaid, the present embodiment adopts a configuration in which the P-channel FET and the N-channel FET are coupled in parallel to each other in each of the first to fourth interruption switches 41 to 44, so that even in the specific abnormal state, the first to fifth interruption switches 41 to 45 are all turned on when the battery pack 2 is attached to the charger 4.

Because of the above-described configuration of the first to fourth interruption switches 41 to 44, even in the aforementioned specific abnormal state, the FET Q1$a$ is turned on whereas the FET Q1$b$ is not turned on in the first interruption switch 41 when the battery pack 2 is attached to the charger 4. Specifically, in the first interruption switch 41, the battery voltage VB is applied to the resistor R1$c$, resulting in generation of a current path through which an electric current flows from the resistor R1$c$ via the resistor R1$d$ and a parasitic diode of the FET Q1$b$ to a low electric potential side. Consequently, a voltage is generated across the resistor R1$d$ coupled between the gate and the source of the FET Q1$a$, and the FET Q1$a$ is turned on.

Thus, even in the aforementioned specific abnormal state, as far as the battery voltage value has a value sufficient for turning on at least the fifth interruption switch 45, all of the interruption switches 41 to 45 can be turned on by attaching the battery pack 2 to the charger 4.

(3) Effect of First Embodiment

According to the above-described first embodiment, following effects can be obtained.

In the battery pack 2 of the first embodiment, when the battery 10 is in the battery overdischarge state, the interrupter 35 interrupts the power supply line 26 and all of the monitor lines 21 to 25. Accordingly, an electrical connection through the power supply line 26 between the battery 10 and the cell-voltage monitoring circuit 16, and electrical connections through the monitor lines 21 to 25 between the battery 10 and the cell-voltage monitoring circuit 16, are all interrupted. Consequently, an electric current does not flow from the battery 10 to the cell-voltage monitoring circuit 16 through the power supply line 26 nor the monitor lines 21 to 25.

For this reason, when the battery overdischarge state occurs, it is possible to sufficiently inhibit discharge from the battery 10 to the cell-voltage monitoring circuit 16, thereby sufficiently inhibiting development of the battery overdischarge state.

Moreover, the interrupter 35 comprises five interruption switches 41 to 45 and the switching driver 36. The interruption switches 41 to 45 are turned on or off by the switching driver 36. Therefore, conduction and interruption of the power supply line 26 and the monitor lines 21 to 25 can be efficiently performed with a simple configuration.

Furthermore, among the five interruption switches 41 to 45, the fifth interruption switch 45 is provided in the highest common line 20 and has two functions: one function is to conduct and interrupt the fifth monitor line 25 provided for inputting a voltage of the positive electrode of the fifth cell 15 to the cell-voltage monitoring circuit 16; and the other function is to conduct and interrupt the power supply line 26 provided for supplying the battery power to the cell-voltage monitoring circuit 16.

Therefore, as compared with a configuration where an interruption switch is provided for conducting and interrupting the fifth monitor line 25 and another interruption switch is provided for conducting and interrupting the power supply line 26, the fifth interruption switch 45 allows simplifying the configuration of the battery pack 2 and achieves cost reduction of the battery pack 2.

Moreover, in the present embodiment, when the interruption switches 41 to 45 are turned off by the interrupter 35 due to occurrence of the battery overdischarge state, the interruption switches 41 to 45 can be turned on again by attaching the battery pack 2 to the charger 4. Thus, the battery 10 can be charged, while making the cell-voltage monitoring circuit 16 operate normally.

In the present embodiment, the interrupter 35 comprises the overdischarge determiner 37 that determines whether the battery 10 is in the battery overdischarge state. The switching driver 36 turns off the interruption switches 41 to 45 upon determination of the battery overdischarge state by the overdischarge determiner 37. Therefore, with the overdischarge determiner 37, conditions for turning on and off the interruption switches 41 to 45 by the interrupter 35 can be specified in a relatively any manner.

Specifically, in the present embodiment, the overdischarge determiner 37 is configured to determine that the battery 10 is in the battery overdischarge state when the battery voltage value is less than the battery overdischarge threshold. The battery overdischarge threshold is specified to be a value lower than a value obtained by multiplying the cell overdischarge threshold in the cell-voltage monitoring circuit 16 with the number of cells, i.e., "5". For this reason, when the battery 10 is further discharged, the cell-voltage monitoring circuit 16 outputs the overdischarge detection signal before determination of the battery overdischarge state by the overdischarge determiner 37. In other words, when the battery 10 is further discharged, the interruption switches 41 to 45 are not immediately turned off; prior to such turning off, the overdischarge detection signal is outputted. Therefore, in the battery pack 2, the discharge from the battery 10 to the tool body 6 can be stopped before the interruption switches 41 to 45 are turned off.

Moreover, each of the first to fourth interruption switches 41 to 44 comprises the P-channel FET and the N-channel FET coupled in parallel to each other, as semiconductor switches for conducting and interrupting the corresponding monitor lines. Thus, when the battery pack 2 is attached to the charger 4 after the interruption switches 41 to 45 are all interrupted due to occurrence of a state similar to the aforementioned specific abnormal state, even if the P-channel FET of at least one interruption switch is not turned on, the N-channel FET of this interruption switch is turned on. Therefore, the interruption switches 41 to 45 are all interrupted due to the occurrence of the state similar to the aforementioned specific abnormal state, all of the interruption switches 41 to 45 can be turned on again by attaching the battery pack 2 to the charger 4.

It is to be noted that the battery pack 2 corresponds to one example of a battery device of the present disclosure. Any of the first to fifth interruption switches 41 to 45 corresponds to one example of a monitor line interruption switch of the present disclosure. The fifth interruption switch 45 also corresponds to one example of a power line interruption switch of the present disclosure. The fifth cell 15 corresponds to one example of a highest cell of the present disclosure.

Second Embodiment

Figure 4:
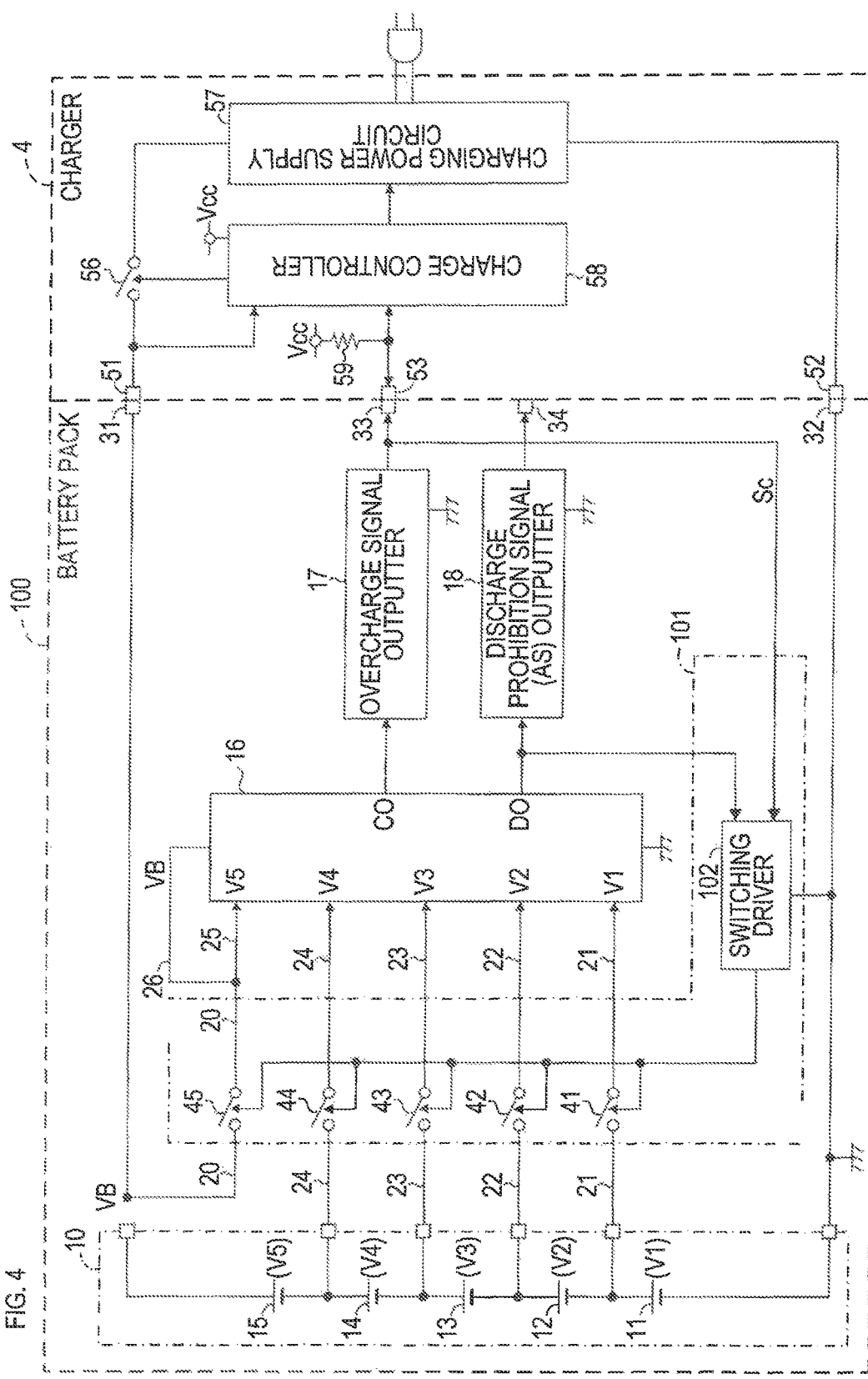
FIG. 4 is an explanatory diagram showing a state where a battery pack of a second embodiment is attached to the charger.

FIG. 4 shows a battery pack 100 of the second embodiment. Also, FIG. 4 shows a state in which the battery pack 100 is attached to the charger 4.

The battery pack 100 of the second embodiment is different from the battery pack 2 of the first embodiment, mainly with respect to configurations of the interrupter.

Specifically, in the first embodiment, the interrupter 35 comprises the overdischarge determiner 37. When the battery overdischarge state is not detected by the overdischarge determiner 37, the interruption switches 41 to 45 are turned on. However, when the battery overdischarge state is detected by the overdischarge determiner 37, the interruption switches 41 to 45 are turned off.

On the other hand, in the battery pack 100 of the second embodiment, an interrupter 101 does not comprise the overdischarge determiner 37. In addition, a switching driver 102 provided in the interrupter 101 has a different configuration from that of the switching driver 36 of the first embodiment.

As in the switching driver 36 of the first embodiment, the charger coupling signal Sc is inputted to the switching driver 102 of the second embodiment. However, the switching driver 102 of the second embodiment is different from the switching driver 36 with respect to the following point: the overdischarge detection signal DO is inputted to the switching driver 102 from the cell-voltage monitoring circuit 16.

The switching driver 102 turns on the interruption switches 41 to 45 when the overdischarge detection signal DO is not outputted from the cell-voltage monitoring circuit 16, specifically, when the logical state of the output terminal for the overdischarge detection signal DO is L-level. On the other hand, the switching driver 102 turns off the interruption switches 41 to 45 when the overdischarge detection signal DO is outputted from the cell-voltage monitoring circuit 16, specifically when the logical state of the output terminal for the overdischarge detection signal DO becomes the high impedance state.

Moreover, in the case that the interruption switches 41 to 45 are turned off due to the overdischarge detection signal DO from the cell-voltage monitoring circuit 16, the switching driver 102 turns on the interruption switches 41 to 45 when the battery pack 100 is attached to the charger 4 and the charger coupling signal. Sc is inputted to the switching driver 102 from the charger 4.

Figure 5:
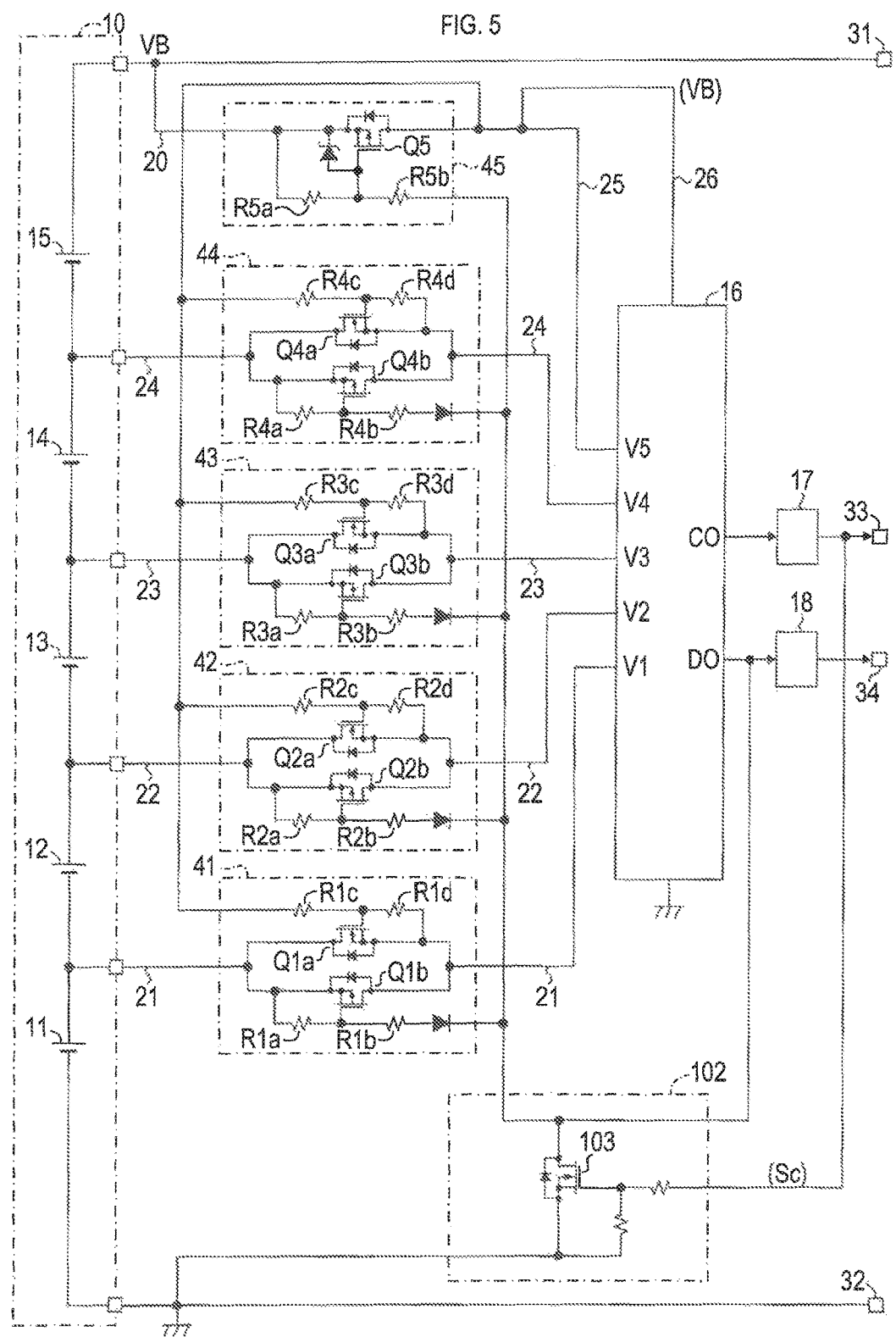
FIG. 5 is a circuit diagram showing a detailed circuit configuration of the battery pack of the second embodiment.

FIG. 5 shows a more detailed circuit configuration of the switching driver 102. As shown in FIG. 5, the switching driver 102 of the second embodiment comprises an N-channel FET 103 (hereinafter referred to as "FET 103"). A drain of the FET 103 is coupled to the switch control line and also to the output terminal for the overdischarge detection signal DO in the cell-voltage monitoring circuit 16. A source of the FET 103 is coupled to the negative terminal 32 (i.e., the ground). The charger coupling signal Sc from the charger 4 is inputted to a gate of the FET 103.

With the above-described configuration, when the overdischarge detection signal DO is not outputted from the cell-voltage monitoring circuit 16, the logical state of the output terminal for the overdischarge detection signal DO is L-level; thus, the interruption switches 41 to 45 are all turned on. When the overdischarge detection signal DO is outputted from the cell-voltage monitoring circuit 16, the logical state of the output terminal for the overdischarge detection signal DO becomes the high impedance state; thus, the interruption switches 41 to 45 are all turned off.

After the interruption switches 41 to 45 are all turned off due to the output of the overdischarge detection signal DO from the cell-voltage monitoring circuit 16, the charger coupling signal Sc is inputted to the switching driver 102 from the charger 4 when the battery pack 100 is attached to the charger 4. In this case, the FET 103 in the switching driver 102 is turned on. When the FET 103 is turned on, an electric potential of the switch control line becomes the ground potential, thereby turning on the interruption switches 41 to 45. Therefore, as in the first embodiment, the battery 10 can be charged in a state where the monitor lines 21 to 25 and the power supply line 26 are all conducted and the cell-voltage monitoring circuit 16 is operated normally.

Other Embodiments

Although modes for carrying out the present disclosure have been described, the present disclosure is not limited to the above-described embodiments and can be carried out with various modifications thereof.

(1) It is merely one example that each of the first to fourth interruption switches 41 to 44 comprises the P-channel FET and the N-channel FET that are coupled in parallel to each other. Each of the first to fourth interruption switches 41 to 44 may be, for example, configured without the N-channel FET, and may be configured in the same manner as in the fifth interruption switch 45.

Also, it is merely one example to use the FETs as the interruption switches 41 to 45, and other semiconductor switching elements that are not FETs may be used. Moreover, the use of the semiconductor switching elements as the interruption switches 41 to 45 is not essential, and elements other than the semiconductor switching elements may be used.

(2) In each of the above-described embodiments, one common fifth interruption switch 45 is used as a switch for conduction or interruption of the fifth monitor line 25 and also as a switch for conduction or interruption of the power supply line 26. However, an interruption switch may be provided separately for each of the fifth monitor line 25 and the power supply line 26.

(3) It is merely one example that in the switching driver 36 of the first embodiment, the first driver 96 comprises two FETs, namely, the FET 96a and the FET 96b, that are serially coupled to each other. The first driver 96 may comprise, for example, one semiconductor switching element. In addition, in the first driver 96, an element other than the FET may be used as the semiconductor switching element, and other switching devices than the semiconductor switching element may be used. In other words, the first driver 96 can adopt various configurations that enable to turn on or off the interruption switches 41 to 45 depending on the output signal from the reset IC 90.

The same can be applied to the second driver 95; it is merely one example that the second driver 95 comprises the NPN bipolar transistor. The second driver 95 may comprise at least one semiconductor switching element that is not the NPN bipolar transistor. The second driver 95 may use a switching device other than the semiconductor switching element.

(4) It is not essential that the overdischarge determiner 37 of the first embodiment comprises the reset IC 90. The overdischarge determiner 37 may comprise other configurations that enable to appropriately determine whether the battery overdischarge state occurs so as to output the determination results.

(5) In the first embodiment, the condition for turning off the interruption switches 41 to 45 is a condition where the battery 10 is in the battery overdischarge state, specifically, a condition where the battery voltage value is less than the battery overdischarge threshold. However, the condition for turning off the interruption switches 41 to 45 may be specified to be other conditions. For example, the interruption switches 41 to 45 may be turned off when at least any one of the cell voltage values V1 to V5 is less than a specified threshold value. In this case, the specified threshold value may be, for example, a value the same as that of the cell overdischarge threshold used in the cell-voltage monitoring circuit 16, or may be a value lower than the cell overdischarge threshold. In addition, the interruption switches 41 to 45 may be turned off, for example, when at least one of the following conditions is satisfied: the battery voltage value is less than the battery overdischarge threshold; and at least any one of the cell voltage values V1 to V5 is less than a specified threshold value.

(6) The configuration shown in FIG. 5 as the switching driver 102 of the second embodiment is merely one example. The switching driver 102 may comprise other configurations that enable to turn off the interruption switches 41 to 45 when the overdischarge detection signal DO is outputted from the cell-voltage monitoring circuit 16 and that also enable to turn on the interruption switches 41 to 45 again when the charger coupling signal Sc is inputted.

(7) It is not essential that the cell-voltage monitoring circuit 16 comprises a function for detecting the overcharge state. In addition, specific modes of the overdischarge detection signal DO that is to be outputted when the cell-voltage monitoring circuit 16 detects the cell overdischarge state may be specified appropriately. Specifically, when detecting the cell overdischarge state, the cell-voltage monitoring circuit 16 may output the overdischarge detection signal DO by other modes that are different from setting the logical state of the output terminal for the overdischarge detection signal DO to be the high impedance state.

(8) Each of the cells 11 to 15 may comprise one cell or cells coupled in parallel. The battery 10 may comprise serially-coupled four or less cells, or serially-coupled six or more cells.

(9) As the battery device, the battery packs 2 and 100 in the above-described embodiments are one example. The present disclosure can be adopted to a battery device having different configurations from those of the battery packs 2 and 100. For example, the present disclosure can be adopted to a battery device that is not configured as the battery packs in the above-described embodiments but that is installed in an on-site electric apparatus.

(10) In the above-described embodiments, functions that one element has may be divided among a plurality of elements, or functions that a plurality of elements have may be integrated to one element. Also, at least part of the configuration of the above-described embodiments may be replaced with a known configuration having the same function. A part of the configuration in the above-described embodiments may be omitted. Moreover, at least part of the configuration in the above-described embodiments may be added to or replaced with a configuration in the above-described other embodiments. Note that various modes that can be included in a technical idea specified by the languages in the claims are the embodiments of the present disclosure.

(11) Other than in the above-described battery pack, the present disclosure can be carried out in various modes, including a system comprising the above-described battery pack, an on-site electric apparatus comprising the above-described battery pack, a program for functioning a computer as the above-described battery pack, a method used in the above-described battery pack, and so on.

What is claimed is:

1. A battery device comprising:
    a battery comprising a positive terminal and a plurality of cells, each cell comprising a positive electrode;
    a cell voltage monitoring part configured to operate with an electric power from the battery and monitor a cell voltage of each of the plurality of cells, the cell voltage monitoring part being further configured to compare a value of the cell voltage of each of the plurality of cells with a cell overdischarge threshold and output an overdischarge detection signal when at least one value of the values of the cell voltages of the plurality of cells is below the cell overdischarge threshold, the cell overdischarge threshold being a voltage value for determining whether each of the plurality of cells is in an overdischarge state;
    a power supply line that couples the positive terminal of the battery to the cell voltage monitoring part;
    a plurality of monitor lines, each corresponding to an individual cell of the plurality of cells, and each coupling the positive electrode of the individual cell to the cell voltage monitoring part; and
    an interrupter configured to interrupt the power supply line and all of the plurality of monitor lines when the battery enters an overdischarge state.

2. The battery device according to claim 1,
    wherein the interrupter comprises:
    a power supply line interruption switch provided on the power supply line and configured to conduct or interrupt the power supply line;
    a plurality of monitor line interruption switches, each corresponding to an individual monitor line of the plurality of monitor lines, and each being provided on the individual monitor line so as to conduct or interrupt the individual monitor line; and
    a switch driver configured to interrupt the power supply line by the power supply line interruption switch and interrupt all of the plurality of monitor lines by all of the plurality of monitor line interruption switches when the battery enters the overdischarge state.

3. The battery device according to claim 2,
    wherein the plurality of cells is serially coupled to one another and comprises a highest cell having a highest electric potential,
    wherein the battery device further comprises a common line comprising a first end and a second end, the first end being coupled to the positive electrode of the highest cell, and the second end being coupled to the power supply line and a highest monitor line of the plurality of monitor lines, the highest monitor line corresponding to the highest cell, and
    wherein the plurality of monitor line interruption switches comprises a highest monitor line interruption switch corresponding to the highest cell, and the highest monitor line interruption switch is provided on the common line and is configured to further function as the power supply line interruption switch.

4. The battery device according to claim 1,
    wherein each of the plurality of cells is configured to be rechargeable,
    wherein the battery device is configured to be coupled to a charger that charges the battery, and wherein the interrupter is further configured to conduct the power supply line and all of the plurality of monitor lines when the battery device is coupled to the charger.

5. The battery device according to claim 2,
wherein each of the plurality of cells is configured to be rechargeable,
wherein the battery device is configured to be coupled to a charger that charges the battery and is configured such that a charger coupling signal is inputted to the battery device from the charger when the battery device is coupled to the charger, and
wherein the switch driver is further configured to conduct the power supply line by the power supply line interruption switch and conduct all of the plurality of monitor lines by all of the plurality of monitor line interruption switches regardless of whether the battery is in the overdischarge state, when the charger coupling signal is inputted from the charger to the battery device.

6. The battery device according to claim 2,
wherein the interrupter comprises an overdischarge determiner configured to determine whether the battery is in the overdischarge state, and
wherein the switch driver is configured to interrupt the power supply line by the power supply line interruption switch and interrupt all of the plurality of monitor lines by all of the plurality of monitor line interruption switches when the overdischarge determiner determines that the battery is in the overdischarge state.

7. The battery device according to claim 6,
wherein the overdischarge determiner is configured to determine that the battery is in the overdischarge state when a voltage value of the battery is less than a battery overdischarge threshold, the battery overdischarge threshold being a voltage value for determining whether the battery is in the overdischarge state.

8. The battery device according to claim 7,
wherein the battery overdischarge threshold is a value lower than a value obtained by multiplying the cell overdischarge threshold with the number of the plurality of cells.

9. The battery device according to claim 2,
wherein the cell voltage monitoring part is configured to output the overdischarge detection signal to the switch driver, and
wherein the switch driver is configured to interrupt the power supply line by the power supply line interruption switch and interrupt all of the plurality of monitor lines by all of the plurality of monitor line interruption switches when the overdischarge detection signal is inputted to the switch driver from the cell voltage monitoring part.

10. The battery device according to claim 2,
wherein the power supply line interruption switch is configured to conduct the power supply line when the power supply line interruption switch is turned on, and interrupt the power supply line when the power supply line interruption switch is turned off, and
wherein the switch driver is configured to turn off the power supply line interruption switch so as to interrupt the power supply line.

11. The battery device according to claim 2,
wherein each of the plurality of monitor line interruption switches is configured to conduct the individual monitor line when each of the plurality of monitor line interruption switches is turned on, and interrupt the individual monitor line when each of the plurality of monitor line interruption switches is turned off, and wherein the switch driver is configured to turn off all of the plurality of monitor line interruption switches so as to interrupt all of the plurality of monitor lines.

12. The battery device according to claim 2,
wherein the plurality of cells is serially coupled to one another and comprises a highest cell having a highest electric potential,
wherein the plurality of monitor line interruption switches comprises a highest monitor line interruption switch corresponding to the highest cell, and remaining at least one monitor line interruption switch,
wherein the remaining at least one monitor line interruption switch comprises a P-channel FET and an N-channel FET coupled in parallel to each other, the P-channel FET comprising a source and a drain, the source of the P-channel FET being coupled to the positive electrode of at least one cell of the plurality of cells, the at least one cell corresponding to the remaining at least one monitor line interruption switch, and the source of the P-channel FET being further coupled to a drain of the N-channel FET, and the drain of the P-channel FET being coupled to the cell voltage monitoring part and a source of the N-channel FET, and
wherein the switch driver is configured to turn on the P-channel FET and the N-channel FET of the remaining at least one monitor line interruption switch when interrupting all of the plurality of monitor lines.

13. The battery device according to claim 12,
wherein the switch driver is configured to apply a first voltage between a gate of the P-channel FET and the source of the P-channel FET so as to turn on the P-channel FET, and apply a second voltage between the source of the N-channel FET and a gate of the N-channel FET so as to turn on the N-channel FET, the first voltage being a divided voltage of a voltage of the positive electrode of the at least one cell, and the second voltage being a divided voltage of a voltage difference between a voltage of the battery and the voltage of the positive electrode of the at least one cell.

14. A method of protecting a battery device from overdischarge, wherein the battery device comprises a battery comprising a positive terminal and a plurality of cells, each cell comprising a positive electrode, a cell voltage monitoring part configured to operate with an electric power from the battery and monitor a cell voltage of each of the plurality of cells, a power supply line that couples the positive terminal of the battery to the cell voltage monitoring part, and a plurality of monitor lines in which each of the plurality of monitor lines corresponds to an individual cell of the plurality of cells and each of the plurality of monitor lines couples the positive electrode of the individual cell to the cell voltage monitoring part, the method comprising:
comparing a value of the cell voltage of each of the plurality of cells with a cell overdischarge threshold by the cell voltage monitoring part, the cell overdischarge threshold being a voltage value for determining whether each of the plurality of cells is in an overdischarge state;
outputting an overdischarge detection signal from the cell voltage monitoring part when at least one value of the values of the cell voltages of the plurality of cells is below the cell overdischarge threshold;
interrupting the power supply line when the battery enters an overdischarge state; and
interrupting all of the plurality of monitor lines when the battery enters the overdischarge state.

15. A method of protecting a battery device from overdischarge, wherein the battery device comprises a battery comprising a positive terminal and a plurality of cells, each cell comprising a positive electrode, a cell voltage monitoring part configured to operate with an electric power from the battery and monitor a cell voltage of each of the plurality of cells, a power supply line that couples the positive terminal of the battery to the cell voltage monitoring part, and a plurality of monitor lines in which each of the plurality of monitor lines corresponds to an individual cell of the plurality of cells and each of the plurality of monitor lines couples the positive electrode of the individual cell to the cell voltage monitoring part, the method comprising:
configuring the cell voltage monitoring part such that the cell voltage monitoring part compares a value of the cell voltage of each of the plurality of cells with a cell overdischarge threshold and outputs an overdischarge detection signal when at least one value of the values of the cell voltages of the plurality of cells is below the cell overdischarge threshold, the cell overdischarge threshold being a voltage value for determining whether each of the plurality of cells is in an overdischarge state;

providing a power supply line interruption switch on the power supply line, the power supply line interruption switch being configured to interrupt the power supply line when the battery enters an overdischarge state; and providing a plurality of monitor Brie interruption switches, respectively, on the plurality of monitor lines, each of the plurality of monitor line interruption switches corresponding to an individual monitor line of the plurality of monitor lines, and each of the plurality of monitor line interruption switches being configured to interrupt the individual monitor line when the battery enters the overdischarge state.

* * * * *